United States Patent
Mogensen

(10) Patent No.: US 6,697,694 B2
(45) Date of Patent: Feb. 24, 2004

(54) APPARATUS AND METHOD FOR CREATING FLEXIBLE CIRCUITS

(75) Inventor: Steven Allen Mogensen, Lakeville, MN (US)

(73) Assignee: Electronic Materials, L.L.C., Lakeville, MN (US)

( * ) Notice: Subject to any disclaimer, the term of this patent is extended or adjusted under 35 U.S.C. 154(b) by 0 days.

(21) Appl. No.: 10/364,184

(22) Filed: Feb. 11, 2003

(65) Prior Publication Data

US 2003/0149505 A1 Aug. 7, 2003

Related U.S. Application Data

(63) Continuation of application No. 09/140,434, filed on Aug. 26, 1998, now abandoned.

(51) Int. Cl.$^7$ .............................................. G06F 19/00
(52) U.S. Cl. ...................... 700/119; 264/239; 427/261
(58) Field of Search ........................ 700/95, 119, 182, 700/207, 118, 121, 283; 118/325; 264/239, 25, 308; 427/385.5, 407.1, 372.2, 226, 261

(56) References Cited

U.S. PATENT DOCUMENTS

| | | | | |
|---|---|---|---|---|
| 4,537,811 A | | 8/1985 | Nablo ........................ 428/166 |
| 4,665,492 A | * | 5/1987 | Masters ...................... 700/119 |
| 4,944,817 A | | 7/1990 | Bourell et al. ............ 156/272.8 |
| 5,121,329 A | | 6/1992 | Crump ........................ 700/95 |
| 5,136,515 A | * | 8/1992 | Helinski ..................... 700/119 |
| 5,287,435 A | * | 2/1994 | Cohen et al. ............... 345/418 |
| 5,340,433 A | | 8/1994 | Crump ........................ 156/578 |
| 5,340,656 A | * | 8/1994 | Sachs et al. ................. 428/546 |
| 5,622,216 A | * | 4/1997 | Brown ........................ 164/71.1 |
| 5,633,021 A | | 5/1997 | Brown et al. ............... 425/375 |
| 5,672,380 A | | 9/1997 | Uchida et al. .............. 427/180 |
| 5,709,905 A | * | 1/1998 | Shaw et al. ..................... 427/8 |
| 5,733,509 A | | 3/1998 | Ackley et al. .............. 422/131 |

(List continued on next page.)

OTHER PUBLICATIONS

Microsoft Press Computer Dictionary, 3rd Ed, 1997, 3rd., p. 90.*

Primary Examiner—Ramesh Patel
Assistant Examiner—Edward F. Gain, Jr.
(74) Attorney, Agent, or Firm—Westman, Champlin & Kelly, P.A.

(57) ABSTRACT

A method and apparatus for forming a flexible circuit of predetermined design, and in particular to the making of a functioning flexible circuit by depositing multiple layers of a variety of materials in fluid or component form in a set configuration onto a substrate. A source for each of the materials is provided. In one embodiment, the materials are applied to the substrate through accurate positioning and moving of the dispensing heads in three dimensions and through accurate control of the amount of material applied. In some embodiments, the substrate is a flexible film. In some embodiments, successive layers of electronic circuitry are formed by successively printing and then curing each layer, one on top of the last, starting with a flexible substrate, such as polyester film. Not only are conductive traces (i.e., wiring) printed (i.e., by dispensing and curing properly selected fluids) using the methods and/or systems described below, but also passive components (such as, for example, resistors, capacitors, and/or inductors), and/or active components (such as, for example, transistors, switches, amplifiers, filters, electric batteries, memory and/or logic).

7 Claims, 8 Drawing Sheets

U.S. PATENT DOCUMENTS

| | | | |
|---|---|---|---|
| 5,758,575 A * | 6/1998 | Isen et al. | 101/153 |
| 5,764,521 A * | 6/1998 | Batchelder et al. | 700/196 |
| 5,893,404 A * | 4/1999 | Mendez et al. | 164/71.1 |
| 5,900,207 A * | 5/1999 | Danforth et al. | 264/603 |
| 5,906,863 A | 5/1999 | Lombardi et al. | 427/385.5 |
| 5,980,998 A | 11/1999 | Sharma et al. | 427/559 |
| 6,010,771 A * | 1/2000 | Isen et al. | 428/209 |
| 6,243,616 B1 | 6/2001 | Droscher et al. | 700/118 |
| 6,253,116 B1 | 6/2001 | Zhang et al. | 700/119 |
| 6,259,962 B1 | 7/2001 | Gothait | 700/118 |
| 6,274,412 B1 | 8/2001 | Kydd et al. | 257/32 |
| 6,510,356 B2 * | 1/2003 | Seshan | 700/95 |
| 6,547,995 B1 * | 4/2003 | Comb | 264/40.1 |
| 6,548,122 B1 * | 4/2003 | Sharma et al. | 427/559 |

* cited by examiner

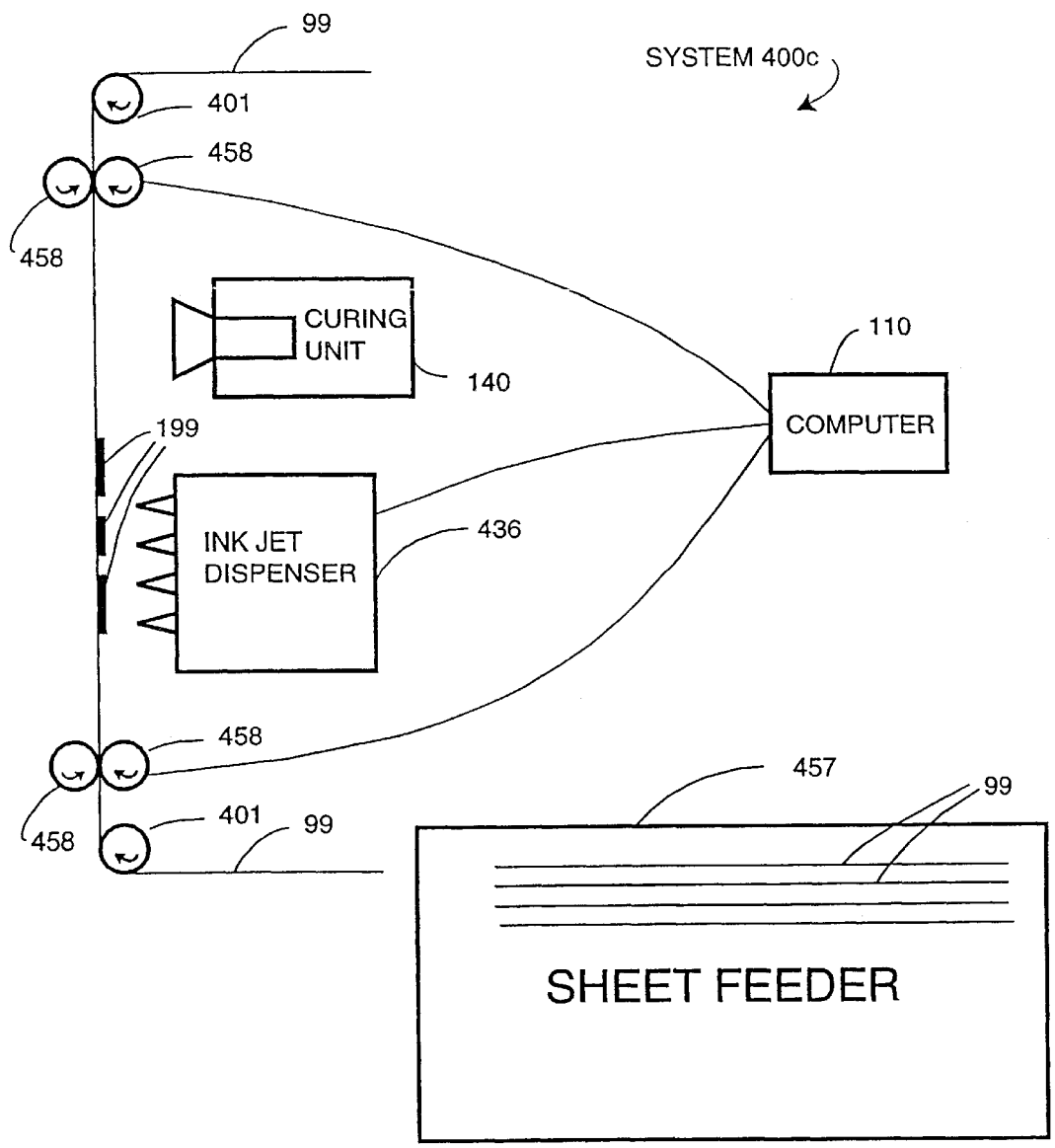

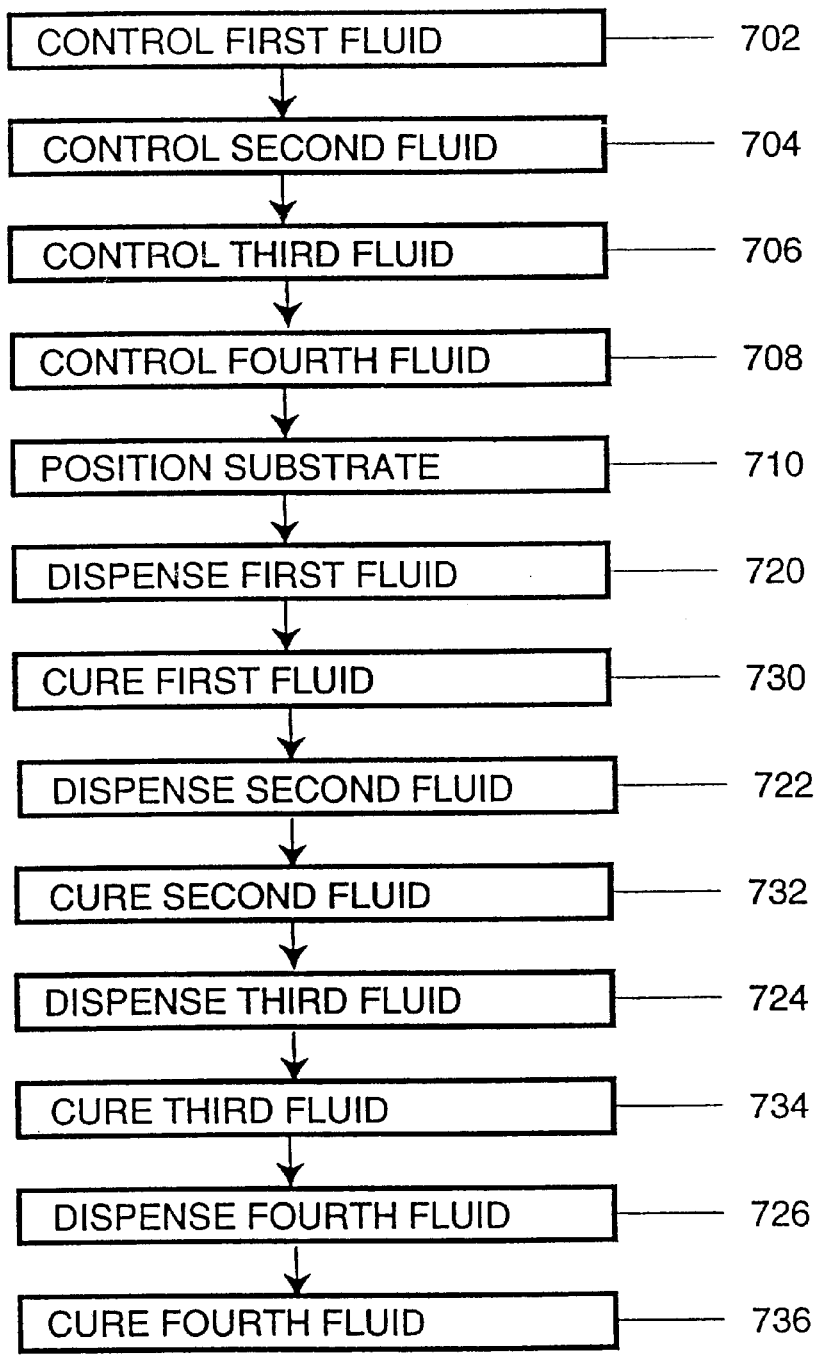

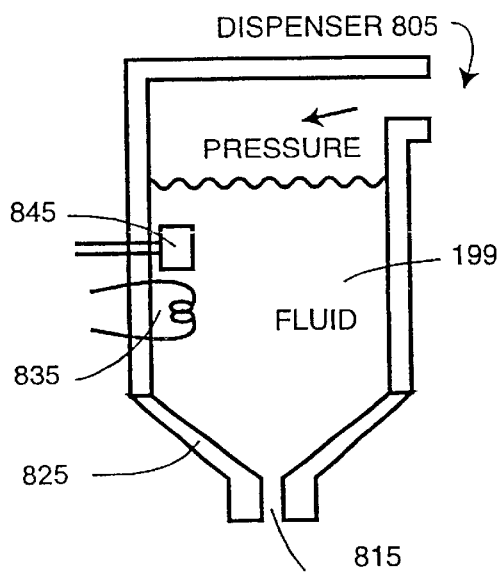
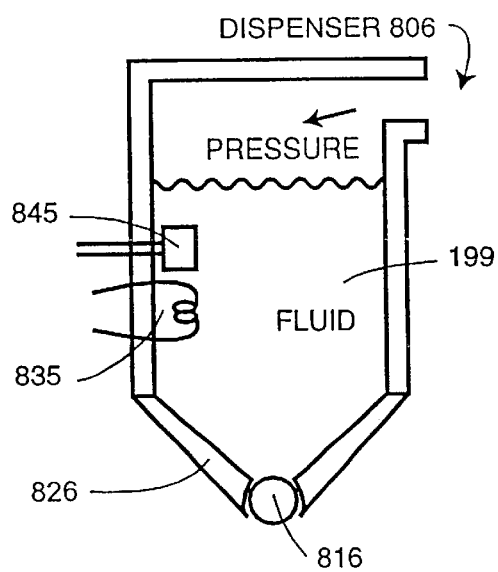
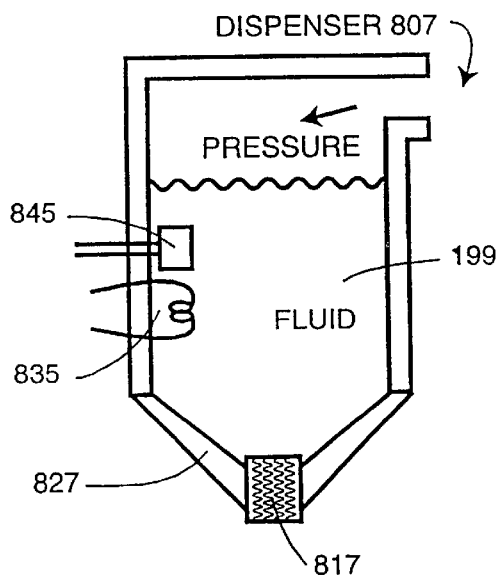
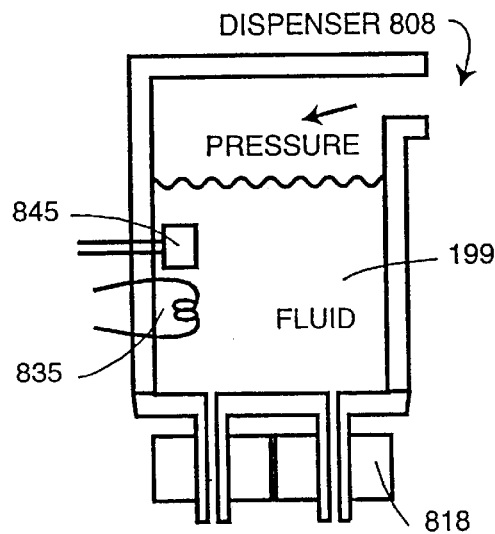

APPARATUS AND METHOD FOR CREATING FLEXIBLE CIRCUITS

FIELD OF THE INVENTION

The present invention relates to an apparatus and a method for forming a flexible circuit of predetermined design, and in particular to the making of a functioning flexible circuit by depositing multiple layers of a variety of materials in a predetermined configuration onto a substrate.

BACKGROUND OF THE INVENTION

A number of methods and techniques for making circuit boards of a predetermined design are known. In accordance with conventional techniques, the desired circuit is initially drawn, either manually or automatically utilizing a computer-aided design program. The prototype circuit is ultimately assembled in the desired configuration through the use of a variety of pre-prepared electronic components and a manual assembly process onto a rigid or flexible base having a pattern of metal conductor traces defining the circuit. The circuit may ultimately be assembled semi-automatically, provided sufficient automation equipment is available and can be justified.

Circuit boards typically include a plurality of individual active and/or passive components that are fastened to a surface of the board, and interconnected using metal conductive traces on an insulating substrate. While early circuit boards used insulating layers made of a rigid fiberglass-reinforced resin or ceramic material, many printed circuit boards in use today employ flexible substrates, typically made of a polyester or polyimide material. As electronic systems required greater speed and complexity in smaller packages, printed circuit designers have developed printed circuit boards having smaller and shorter traces to achieve greater circuit densities.

Although they are called "printed circuits," such circuit boards are typically formed using plating, lithography, and etching technologies. For example, one or both of the opposing surfaces of an insulating substrate are completely covered with a conductive metal such as copper, using methods such as electroless and electrolytic plating. A photoresist layer is deposited over the conductive metal platings and exposed to a light or other radiation image of the desired circuit pattern. The unexposed photoresist is removed, and the uncovered portion of the conductive metal is etched away to reveal the desired conductive circuit patterns. Such photolithographic methods well understood, and are suited for certain high-volume production, but involve numerous steps.

Single-sided-single-layer circuits are the easiest to make, but often have unacceptably long conductive traces (thus having resistance and/or capacitance that is too high). Double-sided circuit boards increase wiring densities by providing two circuit layers fabricated on opposing sides of an insulating substrate. The two circuit layers are interconnected by conductors (typically, plated-through holes) that pass through the insulating layer. Multi-layer printed circuit boards have even higher densities, using two or more laminated and interconnected layers. However, unique problems exist in the fabrication of laminated multilayer printed circuit boards, such as properly sizing and aligning all of the interconnected layers for lamination.

Integrated circuit chips have been attached using surface-mount methods, typically by wave soldering or solder reflow. Methods and techniques for making three-dimensional articles of a predetermined size and shape are also known. U.S. Pat. No. 5,121,329 issued to S. Scott Crump discloses apparatus and a process for forming a three-dimensional (3D) object of predetermined design, in particular to the making of a model or article by depositing multiple layers of a material in a fluid state onto a base. The material is selected and its temperature is controlled so that it solidifies substantially instantaneously upon extrusion or dispensing onto a base, with the build-up of the multiple layers forming the desired article. For example, the object can be modeled and designed in a computer, and then a 3D prototype of the object could be built by extruding fluid plastic onto a base according to instructions from the computer. However, no description of building electronic circuits is provided in this reference.

Thus, a need continues to exist for a relatively simple and efficient process and apparatus by which designers may design and create circuits, particularly flexible circuits, in an automated process. The process and apparatus disclosed herein meets that need with the same ease and simplicity of using a desktop computer and printer, with the entire modeling process being carried out at the operator's computer-aided design (CAD) work station.

BRIEF SUMMARY OF THE INVENTION

The invention teaches a method and apparatus for forming a flexible circuit of predetermined design, and in particular to the making of a functioning flexible circuit by depositing multiple layers of a variety of materials in fluid or component form in a set configuration onto a substrate. A source for each of the materials is provided. In one embodiment, the materials are applied to the substrate through accurate positioning and moving of the dispensing heads in three dimensions and through accurate control of the amount of material applied.

In some embodiments, successive layers of electronic circuitry are formed by successively printing and then curing each layer, one on top of the last, starting with a flexible substrate, such as polyester film. Not only are conductive traces (i.e., wiring) printed (i.e., by dispensing and curing properly selected fluids) using the methods and/or systems described below, but also passive components (such as, for example, resistors, capacitors, and/or inductors), and/or active components (such as, for example, transistors, switches, amplifiers, filters, electric batteries, memory and/or logic).

Another aspect of the invention is to control the viscosity of the fluid within the source in order to control the flow characteristics of the fluid.

Yet another aspect of the invention is to control the temperature throughout the dispensing path in order to maintain accurate control of the flow characteristics of the fluid.

Yet another aspect of the invention is to provide accurate control of the velocity of the dispensing nozzles in order to control the volume of fluid per unit of base area.

Yet another aspect of the invention is to provide a means to cure the deposited materials at controllable time intervals during the process of forming the flexible circuit.

BRIEF DESCRIPTION OF THE DRAWINGS

FIG. 4c is a schematic diagram illustrating yet another embodiment having a roll-fed flexible substrate and an ink-jet-printing-type fluid dispenser system.

FIG. 7 is a block diagram illustrating one embodiment of the invention showing the steps involved in forming flexible circuits.

FIG. 8a is a section view illustrating an embodiment of a dispenser nozzle 805 having a capillary fluid outlet.

FIG. 8b is a section view illustrating an embodiment of a dispenser nozzle 806 having a ball-point fluid outlet.

FIG. 8c is a section view illustrating an embodiment of a dispenser nozzle 807 having a fiber-tip fluid outlet.

FIG. 8d is a section view illustrating an embodiment of a dispenser nozzle 808 having a ink-jet fluid outlet.

DESCRIPTION OF THE PREFERRED EMBODIMENT

Figure 1:
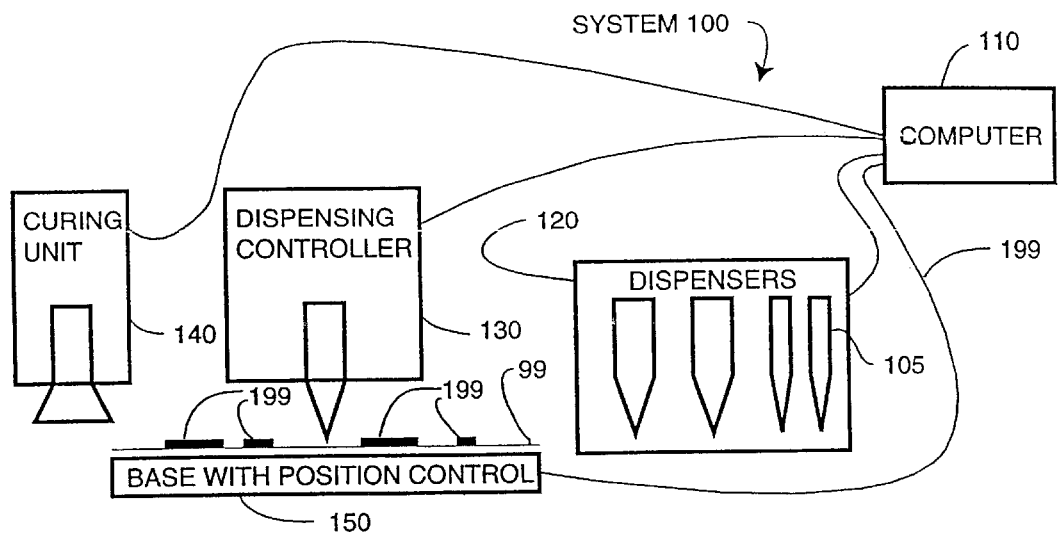
FIG. 1 is a schematic diagram illustrating an embodiment showing many of the features of the invention including a computer, dispensers, a dispensing controller, a curing unit, and a base with position control.

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The present invention provides a computer-controlled system for dispensing conductive and/or insulating and/or semi-conducting fluids to form electronic circuits. One embodiment forms flexible circuits on an oriented polyester film or other suitable backing material. The components of the electronic circuit are "printed" onto the substrate and/or previously printed layers under computer control, and then "cured" to their final form and composition.

In this description and the accompanying claims, "fluid" means liquid, emulsion, suspension, paste, ink, solids in a flowable form, powders, or similar material or mixture that can be dispensed or transferred in a pattern on a substrate. In this description and the accompanying claims, "curing" means causing or allowing a material to change to a substantially solid and contiguous form, such as for example, by exposure to ultra-violet light, exposure to heat, allowing or causing solvents to be removed or dry, adding a catalyst or setting agent, etc. In this description and the accompanying claims, "flexible membrane" or "film" means any relatively thin flexible surface that can be readily bent or shaped into a non-planar shape. In this description and the accompanying claims, "printing" means drawing, plotting, silk-screening, offset printing, ink-jet printing, xerographic printing using a photosensitive drum, etc., and includes any other method for selectively applying a material to a substrate in a pattern. In this description and the accompanying claims, "web" means a film substrate having a length that is substantially longer that a width, and which is typically supplied wound on a roll.

By a conductive layer, we mean a layer of conductive material disposed generally in a plane and defining a conductive pattern, and typically including a plurality of contact pads defined thereon. Such a layer is typically made of a highly conductive material, and is capable of transmitting electric signals between components and other conductive layers electrically connected to the conductive layer. Of the contact pads on a conductive layer, some are designated interconnect pads, for interconnecting the conductive layer with other conductive layers. One or more conductive layers may be attached to one or both sides of a substrate, to form single- or double-sided circuit boards, respectively.

By a multi-layer electronic circuit, we mean a circuit having two or more of such conductive layers superposed with at least a portion of each adjacent set of layers overlapping, such that the layers are mechanically connected, and such that interconnect pads located on the various conductive layers are electrically connected, to transfer signals between the various layers. Adjacent layers are electrically insulated from one another, apart from the electrical connections between the interconnect pads located thereon.

FIG. 1 is a schematic diagram illustrating an embodiment of system 100, showing many of the features of the invention. In this embodiment, system 100 builds a circuit onto a substrate by plotting out patterns in successive layers of circuitry materials using X, Y, and Z relative motions between a substrate attached to base 150 and dispensing controller 130. In this embodiment, the circuitry materials are ink-like fluids that, when cured, form conductors, insulators, resistors, and/or semiconductors. Computer 110 is connected to all parts of the flexible circuit forming system through cables 199, in order to control and to receive input information. In one embodiment, cables 199 carry electrical signals. In another embodiment they carry optical signals. Computer 110 is programmed to perform overall system management.

Dispensing system 120 holds any number of dispensing heads 105 which contain components or fluids that will be dispensed onto a flexible substrate on the base 150. Dispensing system 120 monitors and controls key parameters of the fluid in the dispensing heads so that the fluids are properly prepared and maintained in readiness for the dispensing controller 130. Dispensing system 120 monitors and controls variables including, but not limited to, viscosity and temperature of the fluids in the dispensing heads 105. In one embodiment, temperature sensors within dispensing system 120 detect the temperature of the fluid, and computer 110 controls heaters in dispensing system 120 and/or the dispensing controller 130 to control the temperature of the fluid. In some embodiments, computer 110 conveys a temperature (and/or viscosity) parameter (called a "set point") to dispensing system 120 and/or dispensing controller 130, and the temperature sensing and control is performed within one or both of those subsystems. In some such embodiments, the temperature sensing and control are maintained throughout the path taken by the dispensed fluid 199, i.e., in both the dispensing system 120 and the dispensing controller 130 and wherever else the dispenser heads 105 are moved. In other embodiments, viscosity of the fluid is measured by sensors within dispensing system 120, and computer 110 controls solvent dispensers within dispensing system 120 that add solvent to the fluid as necessary to control viscosity.

At appropriate times in the flexible circuit forming sequence, the dispensing controller 130 will attach itself to one of the one or more dispensing heads 105 and move into position above the flexible substrate attached to base 150. The dispensing controller 130 monitors and controls the volume of fluid dispensed per unit of time as called for by the managing computer 110. In this embodiment, dispensing controller 130 holds one active dispenser (designated dispenser 105A). In one embodiment, the dispensing controller 130 is moved in an X and Y and Z pattern over substrate 99 in order to plot out the desired pattern of fluid 199 from dispenser 105A onto substrate 99. Successive dispensing heads 105 are used to lay down patterns of fluids that, when cured, form various layers of conductors, insulators, resistors, and semiconductors that are used to form a complete circuit.

In one embodiment, dispenser 105A is a syringe-type dispenser having a nozzle output, and dispensing controller 130 includes a pressure actuator and a pressure sensor coupled with dispenser 105A. Computer 110 receives pressure data from the pressure sensor and controls fluid output by driving the pressure actuator based on the pressure data and on the requirements for fluid output per the circuit specification at each given point on the substrate 99. In other embodiments (see, e.g., FIG. 5), a camera 550 or other optical sensor (i.e., any suitable sensor of electromagnetic spectrum energy) is used to detect the amount of fluid 199 that is dispensed, and thus to provide feedback to computer 110 which in turn adjusts the output flow to achieve the desired amount and position of dispensed fluid 199.

The dispensing heads 105 can be a mixture of any number of dispensing designs. Several are described here to demonstrate the types of dispensing that are used in some embodiments, but it will become apparent that other methods of dispensing may be useful within the scope of the invention. Part of the reason multiple dispensing methods are useful is that the fluids available for forming flexible circuits vary significantly in viscosity and formulation and thus require dispensing methods consistent with their viscosity and formulation. For example, Acheson Colloids of Port Huron, Mich. provides a wide range of thick-film fluids (i.e., fluids used to form thick-film circuitry and components) that are used for forming flexible circuits in some embodiments of the present invention. Electrodag 5810 is a two-component epoxy conductive adhesive of very high viscosity. The main component of this conducting adhesive has a viscosity of 500,000 centipoise ("cps"), and is designed for syringe application. Thus some of the methods of dispensing used in some embodiments of the present invention include, but are not limited to, syringe, hollow point, ball point or roller ball (such as are used in various conventional writing pens; optionally including a pressurized fluid reservoir), fiber point, droplet ejection (i.e., "ink-jet") and/or capillary dispensing. Acheson Colloids also supplies Electrodag 478SS, a thermally cured conductive ink of medium viscosity. This thick-film ink has a viscosity of 13,000 to 28,000 cps and is designed for screen-printing application. Acheson Colloids also supplies SS 24210, a thermally cured resistive ink of medium viscosity. This thick-film ink has a viscosity of 25,000 cps and is designed for screen-printing application.

Acheson Colloids also supplies Electrodag 452SS, an ultraviolet curable dielectric coating of medium viscosity. This thick-film ink has a viscosity of 9,000 to 17,000 cps and is designed for screen-printing application.

Acheson Colloids also supplies SS 24840, a silver conductive ink of low viscosity cured through solvent removal. This thick-film ink is designed for flexographic, rotogravure, or slot die casting application.

Further, different dispensing systems and methods are more effective for small-scale versus large-scale production. Other types of dispensing systems contemplated in the present invention include, but are not limited to, offset lithography, xerographic, ink-jet, fiber-tipped pens, etc. Discrete units of electrical components can also be dispensed through mechanical, robotic, or other means.

At appropriate times in the flexible-circuit-forming sequence, curing unit 140 will move into position above the flexible substrate attached to base 150 (or, equivalently, base 150 will move the flexible substrate under curing unit 140). In one embodiment, curing unit 140 provides UV radiation to cure the fluids deposited by the dispensing controller 130. In another embodiment, curing unit 140 provides radiant infra-red heat to cure the fluids (or to speed the curing operation) deposited by the dispensing controller 130. In another embodiment, curing unit 140 provides contact heat (e.g., a hot roller pressed against the substrate) to cure the fluids (or to speed the curing operation) deposited by the dispensing controller 130. In yet another embodiment, curing unit 140 provides heated gas to cure the fluids deposited by the dispensing controller 130. In yet another embodiment, curing unit 140 provides electron-beam radiation to cure the fluids deposited by the dispensing controller 130. In yet another embodiment, curing unit 140 provides gamma radiation to cure the fluids deposited by the dispensing controller 130. In yet another embodiment, the fluid formulations include a catalyst system to provide curing (e.g., a two-part epoxy in which the curing station provides the hardener portion, an oxygen-cured latex carrier in which the curing station provides oxygen blown against the fluid, or other similar system).

The base with position control 150 positions itself as directed by the computer 110 in three-dimensional space in a dynamic mode, such that the fluid deposits provided by the dispensing controller 130 are placed with the proper amount per unit area and in the position and size required by the design of the flexible circuit residing in the managing computer 110.

Figure 2:
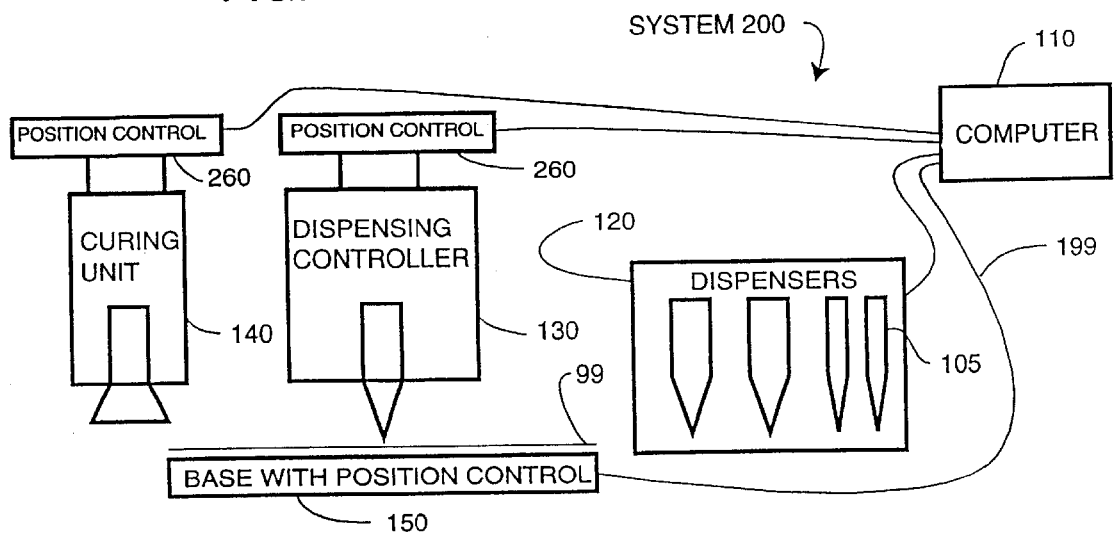
FIG. 2 is a schematic diagram illustrating another embodiment showing many of the features of the invention including a computer, dispensers, a dispensing controller, a position controller for the dispensing controller, a curing unit, a position controller for the curing unit, and a base with position control.

FIG. 2 is a schematic diagram illustrating another embodiment, system 200, showing the additions to this embodiment including two position controls 160, one for the dispensing controller 130 and one for the curing unit 140. These additional three-dimensional positioning controllers add flexibility and speed to the flexible-circuit-forming process. Thus, not only does base 150 move the substrate 99, but position controller 260 associated with dispensing controller 130 moves its dispenser 105A, in order to achieve relative motion between the dispenser 105A and the substrate 99 to control dispensing fluid 199 onto substrate 99. In one embodiment, curing unit 140 is designed to cure only a portion of the fluids on the substrate, and the curing operation is performed in a series of X and Y and Z motions.

Figure 3:
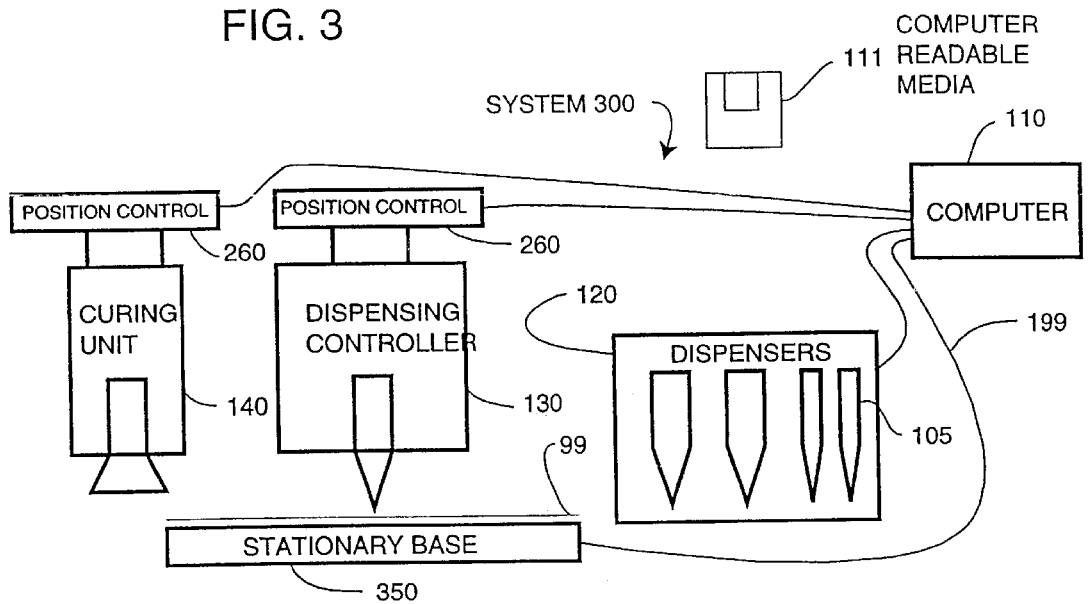
FIG. 3 is a schematic diagram illustrating one embodiment of the invention showing a flexible circuit forming system with a stationary base.

FIG. 3 is a schematic diagram illustrating a simplified embodiment, system 300, of the invention where the base 350 is stationary. In this embodiment all three dimensional position control is performed by the position controllers 160 for the dispensing controller and the curing unit. In one embodiment, the program in the managing computer is provided through the use of computer readable media 111.

Figure 4A:
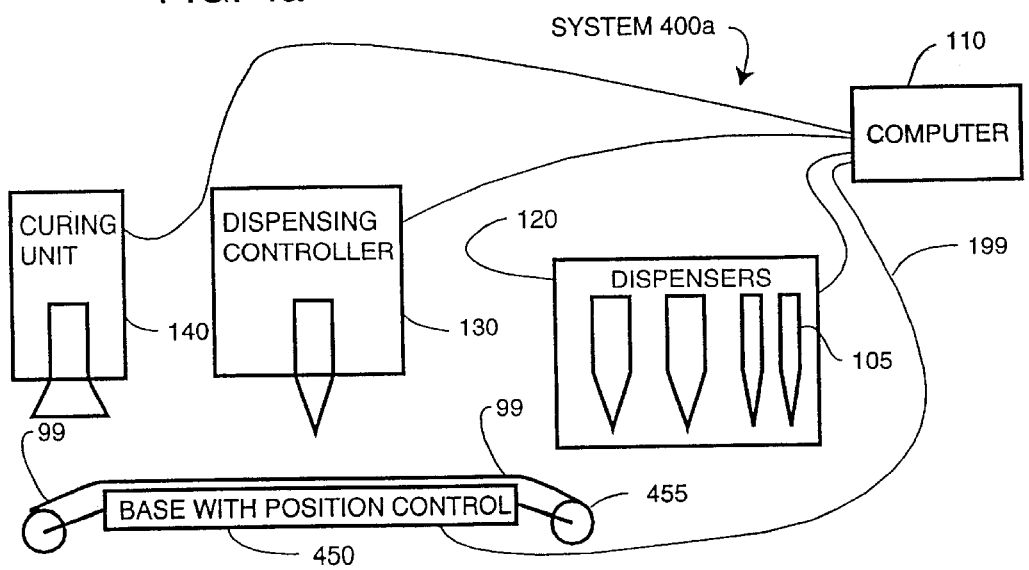
FIG. 4a is a schematic diagram illustrating another embodiment of the invention including a base with a roll-fed flexible substrate supply and an enhanced substrate position control system.

FIG. 4a is a schematic diagram illustrating another embodiment, system 400a, of the invention where the base with position control 450 is designed with the ability to use an essentially unlimited size of substrate thereby providing the capability to form flexible circuits of unlimited size. In one embodiment, rollers 455 with an oriented polyester film constrained to them are monitored and controlled so that the position of the substrate can be accurately controlled to insure the fluid deposits from the dispensing controller 130 are placed with the proper amount per unit area in the position required by the design of the flexible circuit residing in the managing computer 110. This provides the benefits including, but not limited to making very large scale flexible circuits and making large scale prototype circuits that can be reduced through photography or other means to provide the means to form small scale circuits of similar design.

Figure 4B:
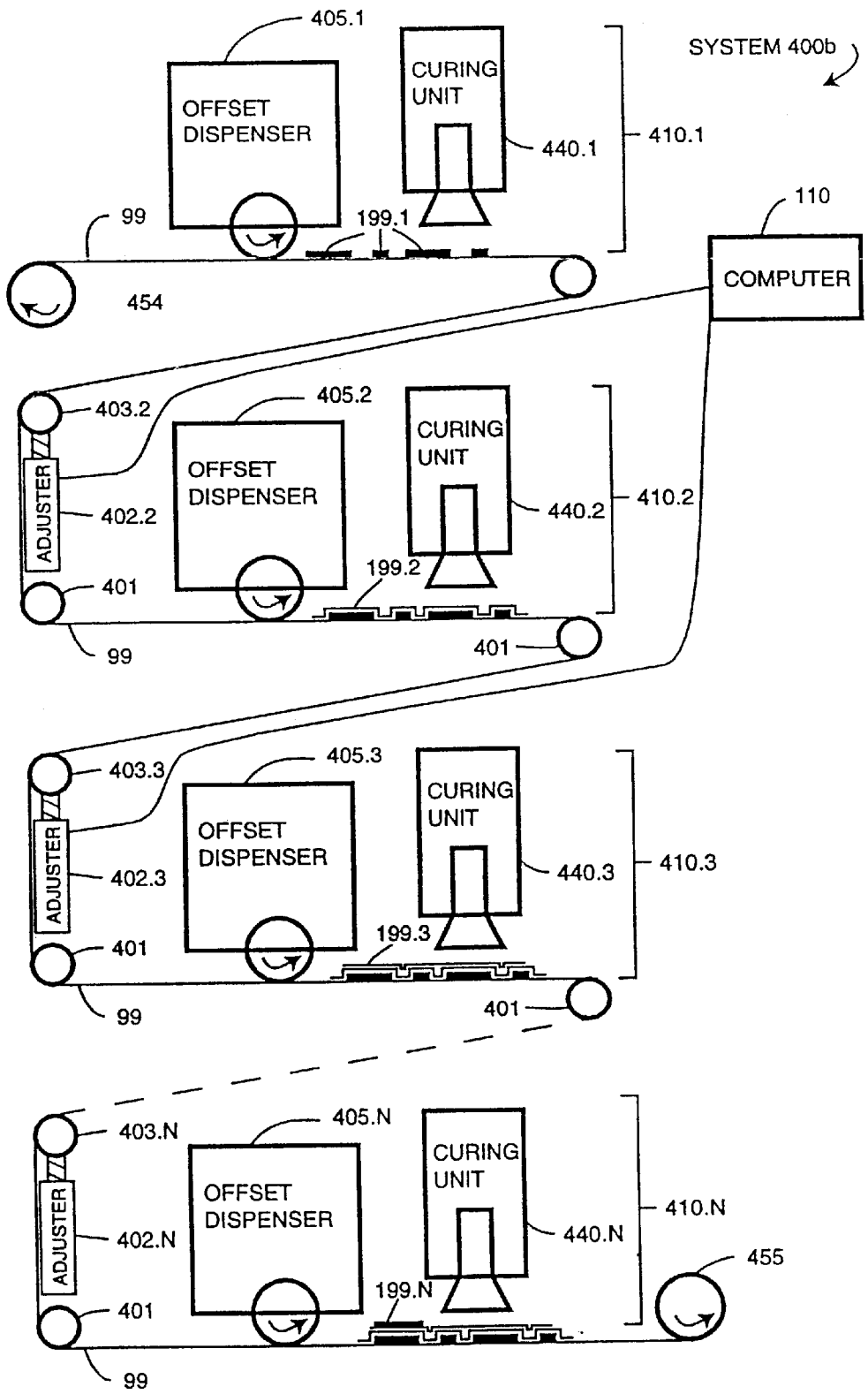
FIG. 4b is a schematic diagram illustrating yet another embodiment having a roll-fed flexible substrate and an offset-printing-type fluid dispenser system.

FIG. 4b is a schematic diagram illustrating yet another embodiment of the present invention having a roll-fed flexible substrate and an offset-printing-type fluid dispenser system. While the systems 100, 200, and 300 of FIGS. 1, 2, and 3, respectively are well suited to producing single prototypes, and small to moderate numbers of flexible circuits in a production environment, system 400b of FIG. 4bis well suited to mass producing large-volume runs of flexible circuits. In the embodiment shown, system 400b includes a source roller 454 from which a continuous sheet of flexible substrate film 99 is unrolled. In various embodiments, substrate film 99 is between about 6 inches (about 15 cm) and about 36 inches (about 90 cm) wide, however other widths may be used. In various embodiments, substrate film 99 is between about 0.5 mils (about 0.00127 cm) and about 2 mils (about 0.00508 cm) thick, however other thicknesses may be used. In one embodiment, substrate film 99 is a polyester film. At the first station 410.1, substrate film 99 passes through offset dispenser 405.1, which prints a pattern of a suitable circuit fluid 199.1 onto substrate film 99. (I.e., offset dispenser 405.1 is otherwise identical to a color-ink offset press section used in the color-printing industry, however it dispenses a fluid 199 that, when cured, forms a conductor trace, an insulator trace, a resistor trace, or a semiconductor trace on substrate film 99. In one embodiment, offset dispensers 405.1, 405.2, 405.3, through 405.n include an aluminum printing sheet having a surface patttern that is defined photolithographically, wherein the surface pattern has some areas that are fluid-philic and other areas that are fluid-phobic relative to fluid 199. Fluid 199 is dispensed from a reservoir via suitable rollers to the aluminum printing sheet, where it transfers only to the fluid-philic areas, and from there is printed onto substrate film 99.) Substrate film 99 then passes through curing unit 440.1, which, in one embodiment, includes a high-intensity ultra-violet light source that causes the patterns of fluid 199.1 to cure. Substrate film 99 then passes over a suitable path of idler rollers 401 to the next station 410.2 where a second layer pattern of fluid 199.2 is dispensed by offset dispenser 405.2 and cured by curing unit 440.2. In one embodiment, one or more of the idler rollers 401 is equipped with an adjuster 402. For example, computer 110 controls adjuster 402.2 (based on input from a suitable sensor—not shown) which moves its respective roller 403.2 to lengthen or shorten the path between stations 410.1 and 410.2, in order to maintain the proper alignment between circuit layers dispensed by these two stations. Similarly, computer 110 controls adjuster 402.3 (based on input from a suitable sensor—not shown) which moves its respective roller 403.3 to lengthen or shorten the path between stations 410.2 and 410.3, in order to maintain the proper alignment between circuit layers dispensed by these two stations. After a suitable number and type of layers has been printed and cured at the N stations (410.1 through 410.N), the completed film substrate is wound on collection roller 455.

In some embodiments (not shown), one or more of the stations 410 include other types of dispensers (such as spray dispensers). In some embodiments, some stations 410 dispense fluid 199 only in areas not previously printed, in order to "plagiarize" the circuit (e.g., station 410.1 would print a pattern of conductors 199.1 as shown in FIG. 4b, station 410.2 would print a pattern of insulator 199.2 of the same thickness, but in a complementary pattern, such that the entire surface becomes planar; this allows successive layers to have better control over fluid dispensing, and reduces problems in dispensing fluid over edges).

In some embodiments, the rollers 401 and the take-up roller 455 are made with a suitably large diameter to reduce small-diameter bending of the completed circuit. In other embodiments, the idler rollers 401 are eliminated, and a straight-line printing path is used through all the stations 410. In some embodiments, the individual circuits are cut from the continuous web after station 410.N, rather than being rolled onto take-up roller 455.

In some embodiments, multiple passes through the printing-press system 400b are required, in order to fabricate the desired number of circuit layers. For example, if using a modified four-color press (i.e., having four stations 410), four passes may be needed to dispense sixteen layers of circuitry, insulation, and/or components. In such embodiments, an adjuster 402 is also used between source roller 454 and the first station 410.1, in order to align the printing at station 410.1 with previous layers of circuitry.

In other embodiments, one or more of the offset dispensers 405 (e.g., 405.1, 405.2, 405.3 and 405.N) described above is replaced by a xerographic drum dispensing subsystem (similar to a laser printer), wherein a photosensitive drum is sensitized, written with a pattern controlled by computer 110. Fluid 199, in this embodiment, is a suitable powder formulation, which is transferred to the patterned areas of the photosensitive drum, and from there onto substrate 99. In this embodiment, curing unit 140 includes a heated fuser roller that cures the deposited powder using heat and pressure, in much the same way that powdered toner in a laser printer is fused to a plastic overhead transparency film (which can replace paper in such a laser printer). The curing operation in this embodiment fuses (or melts) the appropriately selected powder into a contiguous circuit or wiring element.

In some embodiments, once the processing for the circuits themselves is complete, the substrate film is laminated to a suitable mechanical support (such as cardboard). This order allows more accurate thickness dispensing of the circuit fluids 199, since the substrate film thickness is well controlled. In other embodiments, a mechanical backing is laminated to the polyester film 99 before the circuits are printed thereon.

FIG. 4c is a schematic diagram illustrating yet another embodiment, system 400c, having a sheet-fed flexible substrate and an ink-jet-printing-type fluid dispenser system. In this embodiment, which is similar to table-top ink-jet printers used with personal computers, individual sheets of substrate film 99 are fed from sheet feeder 457 through path corresponding to the paper path through a common table-top ink-jet printer. Ink-jet dispenser 436 ejects individual droplets of fluid 199 via nozzles 435 in a pattern under the control of computer 110 using any suitable method such as are widely known in the ink-jet printer art. Ink-jet dispenser 436 is moved back and forth along one dimension of substrate 99 (e.g., along its width), while pinch rollers 458 move the substrate 99 in the other dimension (e.g., along its length), thus providing the X and Y relative motion between dispenser 436 and substrate 99. In one embodiment (not shown), curing unit 140 is attached to dispenser 436, and follows it in the X direction, such that multiple layers of circuitry can be dispensed and cured by multiple passes of dispenser 436 and curing unit 140, without moving substrate 99. In another embodiment, curing unit 140 provides curing across the entire width of substrate 99 as shown, and the substrate is moved using rollers 458 under the control of computer 110 back and forth between the dispenser 436 and the curing unit 140. In one embodiment, ink-jet dispenser 436 includes multiple reservoirs of different fluids 199 (rather than the multiple colors of ink in an ink-jet printer), in order to dispense, for example, conductors, insulators, resistors, and semiconductors.

Figure 5:
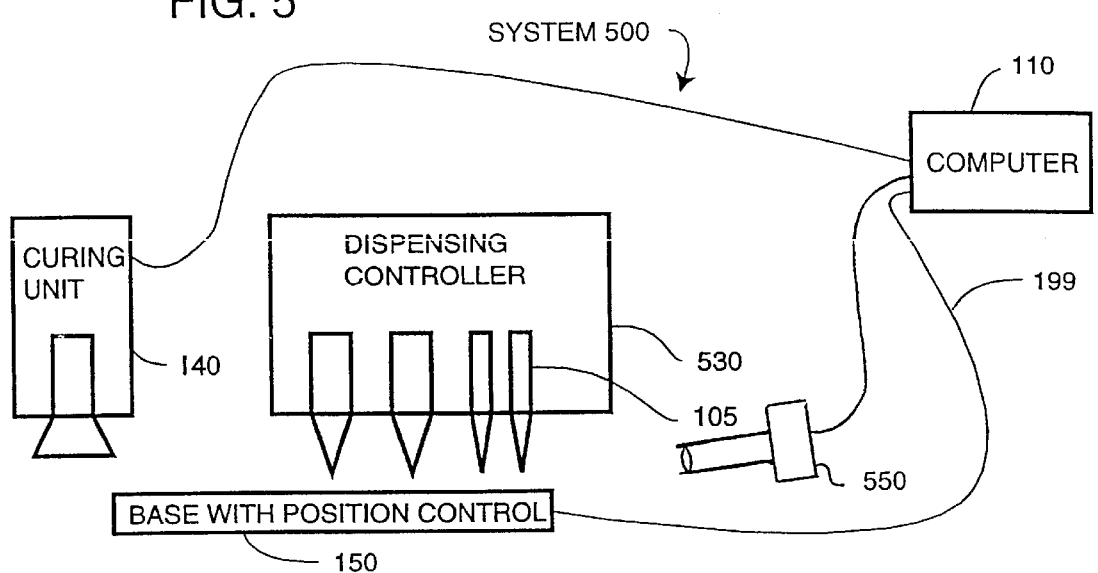
FIG. 5 is a schematic diagram illustrating an embodiment of the invention showing a flexible circuit forming system with a dispensing controller with multiple dispensing heads.

FIG. 5 is a schematic diagram illustrating another embodiment, system 500, of the invention where the dispensing controller 530 is designed with multiple dispensing heads 105. In this embodiment, the functions of 120 and 130 of FIG. 1 are combined in a single unit 530, which controls the relative movement of the dispensers 105, the dispensing of fluids 199 by dispensing heads 105, and the control of temperature and/or viscosity, if desired. Optionally, a machine-vision camera 550 or other optical sensor 550 monitors the dispensing of fluids 199 (sensing, for example the width and thickness of lines that are drawn by the dispensing heads 105), and sends the sensed parameter values to computer 110, in order that computer 110 can adjust the dispensing process to compensate for any out-of-range functions. Otherwise, system 500 of FIG. 5 is identical to FIG. 1.

Figure 6A:
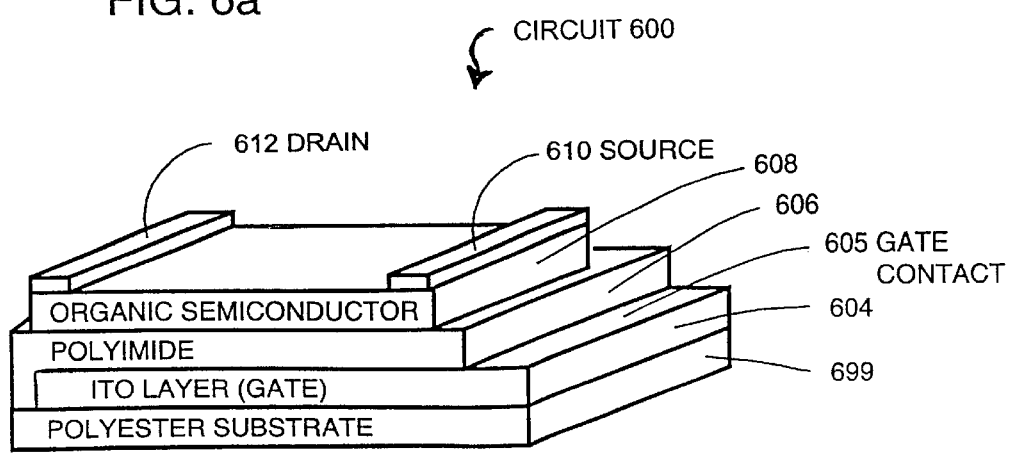
FIG. 6a is an isometric view illustrating an embodiment of a field effect transistor formed with the invention.

FIG. 6a is an isometric view illustrating an embodiment of a field-effect transistor formed with the invention. A polyester substrate 602 coated with a pattern of ITO 604, which is available from Southwall Technologies. The substrate 602 acts as an insulator and the ITO 604 performs as the gate electrode, with contact area 605 providing electrical contact to the gate. In one embodiment, polyimide layer 606 is applied through screen printing, and forms the gate insulator between gate 604 and semiconductor 608. In one embodiment, polyimide 606 is a thin layer of Optimer Al 3046, which is available through the Japan Synthetic Rubber Company. In some embodiments, semiconductor 608 is formed using regioregular poly(3-alkylthiophene)s, which is available from Aldrich Chemical company. The organic semiconductor layer 608 is applied through screen printing, in one embodiment. The drain electrode 612 and source electrodes 610 in this embodiment are applied by screen printing, using a conductive ink, 479SS, from Acheson Colloids Company. In other embodiments, gate 604, gate insulator 606, semiconductor 608, and source and drain electrodes 610 and 612 are applied using any of the other above-described printing (i.e., dispensing-and-curing) techniques.

Figure 6B:
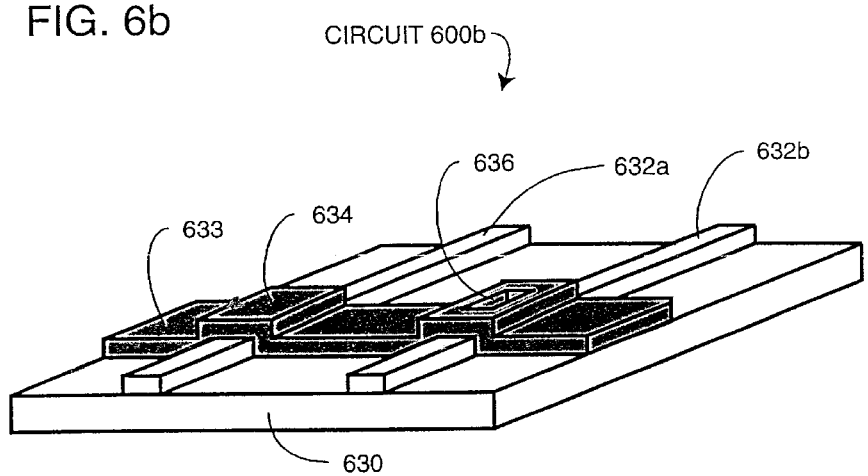
FIG. 6b is an isometric view illustrating an embodiment of conducting and insulating building blocks formed with the invention.

FIG. 6b is an isometric view illustrating an embodiment of conducting and insulating regions formed with the invention. This embodiment demonstrates the ability to build a wide variety of wireways through the use of conducting and insulating inks and substrates. In this embodiment, substrate 630 is a polyester film available from Southwall Technologies. Two conducting wireways 632a and 632b are applied by screen printing, using a conductive ink 479SS from Acheson Colloids Company. Once the conducting wireways 632 are cured (or dried), insulating layer 633 is applied by screen printing, using a insulating ink Electrodag 38DJB16 from Acheson Colloids Company. At location 634 the insulating ink covers the conductor 632a; however, at location 636 an opening in the insulator 633 leaves a contact to the conductor 632b exposed, demonstrating the ability to form connection points in whatever configuration called for by the managing computer 110. Any number of successive conducting, insulating, resistive, or semiconducting layers may be printed on top of the layers shown in FIG. 6b.

Figure 6C:
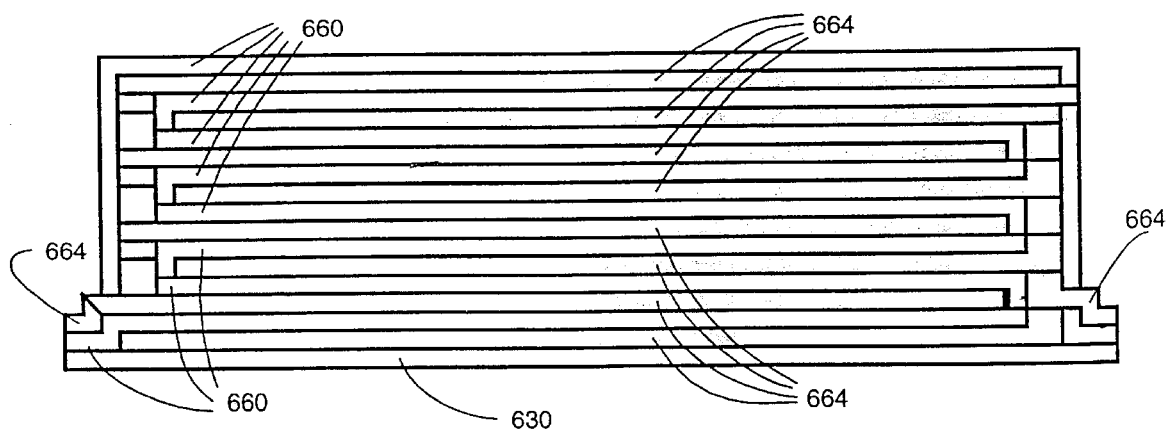
FIG. 6c is a section view illustrating an embodiment of a capacitor formed with the invention.

FIG. 6c is a section view illustrating an embodiment of a capacitor formed using the invention. Capacitance is generated through the use of a multitude of alternating conductive layers 660 and insulating layers 664. In one embodiment, these layers are applied through the use of screen printing.

FIG. 7 is a block diagram illustrating one embodiment, method 700, of the invention showing one method of the present invention used in forming flexible circuits. The first block 702 involves measuring and controlling physical parameters of the first fluid (e.g., measuring the temperature and/or viscosity of a fluid 199a used to form conductive traces or wireways, and adjusting the temperature and/or viscosity to desired values). In many instances the first material used will be a fluid and will require temperature and viscosity control to ensure it is applied properly. Based on instructions from the managing computer 110 (see FIG. 1), the dispensing controller 130 will bring the parameters of the first fluid and its dispenser into a state of readiness for dispensing. Similarly blocks 704, 706, and 708 involve bringing each of a second fluid 199b, a third fluid 199c, and a fourth fluid 199d, respectively, to a state of readiness. Each may require its own unique set of measurements and command instructions from the managing computer 110 and the corresponding responses from dispensing controller 130; however, each must be brought to a state of readiness (if required) as directed by the managing computer 110. In other embodiments, one or more of the fluids are assumed to be ready for dispensing without additional measurement and control, and in those embodiments, one or more of blocks 702–708 are omitted from this method 700. In various embodiments, first fluid 199a, second fluid 199b, third fluid 199c, and fourth fluid 199d, represent any of the fluids 199 indicated in FIGS. 1, 2, 3, 4a, 4b, 4c, or 5, which, when cured, form the circuitry and/or components on substrate 99. In one embodiment, the dispensing and curing of two alternating layers of material (i.e., several cured first fluid layers separated by cured second fluid layers) is performed in order to provide, for example, multiple layers of conductor traces separated by insulators.

At block 710, the substrate is then positioned on and affixed to the base 150 so that it is brought to a state of readiness to accept fluid deposits from the dispensing controller 130.

Once all entities that require a state of readiness are ready or timing is such that they will be ready at the appropriate time, deposition process can begin. Block 720 represents the beginning of the deposition process with the dispensing of the first fluid 199a. As described above, the first fluid is selected from a wide variety of fluids available to form flexible electronic circuits and the first deposition process is selected from a wide variety of deposition processes suitable for the first fluid 199a and available to form flexible electronic circuits.

Blocks 722, 724, and 726 for the second, third, and fourth fluids represent deposition process selection corresponding to their respective fluids 199b, 199c, and 199d, in a manner similar to block 720.

In order to control the flexible-circuit-forming process, the managing computer 110 provides instructions as to the appropriate sequence for depositing then curing the deposited materials. Block 730 represents the curing process for the fluid dispensed at block 720, where any number of suitable curing processes available to cure deposited fluids are selected and used to cure deposited fluids (see the description of various curing methods, above). In this embodiment, the first fluid is deposited 720 and the first fluid is then cured 730.

Blocks 732, 734, and 736 represent the respective curing processes for the second third, and fourth deposited fluids. As with block 730, any suitable one of a number of curing processes that are available to cure deposited fluids is selected, in order to cure the selected fluids.

In the embodiment shown in FIG. 7, method 700, the first, second, third, and fourth fluids are deposited and then cured immediately after dispensing. Many alternate sequences of fluid deposition and curing can and will be used to form flexible circuits within the present invention, depending on many variables including, but not limited to, the design of the flexible circuit, time required to form the flexible circuit, the size of the circuit, etc.

FIG. 8a is a section view illustrating an embodiment of a dispenser nozzle 805 having a capillary fluid outlet. Nozzle 805 includes a reservoir 825 which holds fluid 199. In one embodiment, pressure controlled by computer 110 controls the flow rate of fluid 199, such as by a syringe piston moved into a cylinder formed by reservoir 825. In one embodiment, heater 835 is controlled by computer 110 based on one or more parameters measured by sensor 845 (such as temperature or viscosity). The bottom size and shape of the bottom surface and its capillary opening 815 of nozzle 805 is chosen to provide a desired width and thickness of dispensed fluid 199 onto substrate 99. In one such embodiment, a flat bottom surface having a circular circumference is used.

FIG. 8b is a section view illustrating an embodiment of a dispenser nozzle 806 having a ball-point fluid outlet. Nozzle 806 includes a reservoir 826 which holds fluid 199. Otherwise similar to nozzle 805, nozzle 806 of the embodiment shown includes a ball roller 815 (other embodiments us a cylinder roller). The bottom size and shape of roller 816 is chosen to provide a desired width and thickness of dispensed fluid 199 onto substrate 99.

FIG. 8c is a section view illustrating an embodiment of a dispenser nozzle 807 having a fiber-tip fluid outlet. Nozzle 807 includes a reservoir 827 which holds fluid 199. Otherwise similar to nozzle 805, nozzle 807 of the embodiment shown includes a fiber tip 817 (other embodiments us a porous ceramic or plastic tip). The bottom size and shape of tip 817 is chosen to provide a desired width and thickness of dispensed fluid 199 onto substrate 99.

FIG. 8d is a section view illustrating an embodiment of a dispenser nozzle 808 having a ink-jet fluid outlet. Nozzle 808 includes a reservoir 827 which holds fluid 199. Otherwise similar to nozzle 805, nozzle 807 of the embodiment shown includes one or more ink-jet tips 818 which can be individually actuated to dispense a fluid droplet of a controlled size, which is then propelled using pressure or electrostatic force to jump to the substrate 99.

It is possible to form an extremely large number of variations of flexible circuits using the invention. The components formed by the dispensed and cured fluids include, but are not limited to, wiring, insulation, transmission lines, twisted-pair signal wired, coaxial conductors, antennas, switches, connectors, transistors, resistors, capacitors, indicators and optical displays, etc. Discrete electronic components that are formed in various embodiments include, but are not limited to, wiring, insulation, transmission lines, twisted pairs, coaxial conductors, switches, connectors, transistors, resistors, capacitors, indicators, etc.

In some embodiments, the circuitry is formed on a flexible film substrate. In some such embodiment the film substrate is attached or laminated to a suitable backing material or object. In some embodiments, the backing object is a heat sink. In other embodiments, the backing object is a case for the consumer object being produced, such as the shell of a telephone handset. In yet other embodiments, the circuitry is formed by directly depositing the fluid-formed components on the object being produced, for example, by dispensing and curing the series of fluid patterns and layers directly on the shell of a telephone handset.

In the embodiments described above, the electronic components of the circuit, as well as the wiring or conductive traces, are all formed by dispensing patterns of appropriately selected fluids such as conductive inks, which when cured, form the entire circuit desired. In other embodiments of the present invention, some of the circuitry, including wiring, passive components (such as, for example, resistors, capacitors, and/or inductors), and/or active components (such as, for example, transistors, switches, amplifiers, filters, electric batteries, memory and/or logic) are formed by the printing (i.e., dispensing and curing) methods and/or systems described above. Then, additional components (such as, for example, transistors, memory chips, and/or microprocessors) that can be more economically produced using conventional methods are attached to the surface of the resulting circuit (e.g., circuit 600), in order to form the completed electronic circuitry component.

In one embodiment, the "curing" operations described above for FIGS. 1–7 are performed to a limited extent, and just enough in order to facilitate the dispensing of subsequent layers of circuit-forming fluids. The mostly completed substrate is cut into individual circuits if required, and the flexible circuits are bent or formed into the final desired shape and topology. In some embodiments, the bending and/or rolling operations performed in the manufacture of the circuit can introduce small cracks or discontinuities in some of the wiring or traces. At that point, a final "curing" or "fusing" step is performed, in order that each of the conductive, resistive, semiconducting, and/or insulating regions is again rendered complete and contiguous. In various embodiments, this final fusing step includes ultraviolet radiation and/or heat radiation which causes all of the deposited layers to cure to the final circuitry desired, having contiguous conducting paths where these are desired, and having contiguous insulating regions where these are desired.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A system for producing an electronic component on a substrate, the system comprising:

a computer system;

a first dispenser coupled to the computer system, the first dispenser having a first fluid that, upon curing, forms a solid substantially conductive layer;

a second dispenser coupled to the computer system, the second dispenser having a second fluid that, upon curing, forms a semiconducting and substantially solid layer;

a third dispenser coupled to the computer system, the third dispenser having a third fluid that, upon curing, forms a substantially insulating and substantially solid material;

a positioning mechanism coupled to the computer system, wherein the positioning mechanism holds the substrate and moves the substrate and the first dispenser and second dispenser and third dispenser relative to one another in a series of different relative positions as controlled by the computer system;

wherein the computer system further controls a dispensing rate of the first dispenser, second dispenser, and third dispenser to dispense a controlled amount of the first fluid, second fluid, and third fluid in a predetermined pattern on the substrate defined by the series of different relative positions to form a multi-layer electronic circuit;

a monitor coupled to the computer system that monitors one or more characteristics of the first fluid, second fluid, and third fluid; and a controller coupled to the computer system that controls the one or more characteristics of the first fluid, second fluid, and third fluid based on parameters from the monitor.

2. The system according of claim 1, wherein the substrate is a flexible membrane, and where the positioning mechanism further comprises:

a constraining mechanism that holds the flexible membrane in a substantially flat planar shape.

3. The system according to claim 1, wherein the computer system controls a position and a thickness of the first fluid.

4. The system according to claim 1, further comprising:

a curing station, wherein the computer system controls a curing operation to occur to the substrate at the curing station.

5. A system for producing an electronic component on a substrate, the system comprising:

a computer system;

a first dispenser coupled to the computer system, the first dispenser having a first fluid that, upon curing, forms a solid substantially semiconductive circuit;

a second dispenser coupled to the computer system, the second dispenser having a second fluid that, upon curing, forms a substantially insulating and substantially solid material;

a positioning mechanism coupled to the computer system, wherein the positioning mechanism holds the substrate and moves the substrate and the first and second dispensers relative to one another in a series of different relative positions as controlled by the computer system;

wherein the computer system further controls dispensing rates of the first and second dispensers to dispense a controlled amount of the first and second fluids in a predetermined pattern on the substrate defined by the series of different relative positions to form a semiconductive multi-layer electronic circuit;

a monitor coupled to the computer system that monitors one or more characteristics of the first and second fluids; and a controller coupled to the computer system that controls the one or more characteristics of the first and second fluids based on parameters from the monitor.

6. The system according to claim 5, wherein the substrate is a flexible membrane, and where the positioning mechanism further comprises:

a constraining mechanism that holds the flexible membrane in a substantially flat planar shape.

7. The system according to 5, further comprising;

a curing station, wherein the computer system controls a curing operation to occur to the substrate at the curing station.

* * * * *